(12) United States Patent
Henry et al.

(10) Patent No.: US 7,923,875 B2
(45) Date of Patent: Apr. 12, 2011

(54) ASSEMBLY FOR AN ELECTRIC MACHINE

(75) Inventors: Joseph A. Henry, Vandalia, OH (US); A. Keith Pant, Carlisle, OH (US)

(73) Assignee: A.O. Smith Corporation, Milwaukee, WI (US)

( * ) Notice: Subject to any disclaimer, the term of this patent is extended or adjusted under 35 U.S.C. 154(b) by 319 days.

(21) Appl. No.: 12/109,793

(22) Filed: Apr. 25, 2008

(65) Prior Publication Data

US 2009/0267432 A1 Oct. 29, 2009

(51) Int. Cl.
*H02K 5/22* (2006.01)
(52) U.S. Cl. .......................................... 310/89; 310/64
(58) Field of Classification Search .................. 310/54, 310/64, 88, 89
See application file for complete search history.

(56) References Cited

U.S. PATENT DOCUMENTS

| | | | |
|---|---|---|---|
| 1,531,152 A | 3/1925 | Steen | |
| 1,991,036 A | 2/1935 | Werner | |
| 3,445,698 A | 5/1969 | Miko | |
| 3,748,507 A | 7/1973 | Sieber | |
| 3,833,826 A * | 9/1974 | Barton et al. | 310/52 |
| 4,742,257 A * | 5/1988 | Carpenter | 310/62 |
| 4,839,547 A * | 6/1989 | Lordo et al. | 310/60 A |
| 4,908,538 A * | 3/1990 | Geberth, Jr. | 310/59 |
| 5,331,239 A * | 7/1994 | Kwun et al. | 310/68 R |
| 5,481,151 A * | 1/1996 | Stacy et al. | 310/256 |
| 5,619,085 A * | 4/1997 | Shramo | 310/184 |
| 5,763,969 A * | 6/1998 | Metheny et al. | 310/62 |
| 5,780,946 A | 7/1998 | Nakamura et al. | |
| 5,982,071 A | 11/1999 | Ehrick | |
| 6,107,716 A | 8/2000 | Penketh | |
| 6,229,232 B1 | 5/2001 | Roth-Stielow et al. | |
| 6,472,785 B2 | 10/2002 | Petit et al. | |
| 6,707,185 B2 | 3/2004 | Akutsu et al. | |
| 6,933,638 B2 * | 8/2005 | Hirth | 310/71 |
| 7,027,938 B1 * | 4/2006 | Dister | 702/61 |
| 7,122,928 B2 | 10/2006 | Shindo | |
| 2005/0093382 A1 * | 5/2005 | Hirth | 310/62 |
| 2007/0284954 A1 * | 12/2007 | Lin et al. | 310/58 |

* cited by examiner

*Primary Examiner* — Quyen Leung
*Assistant Examiner* — Naishadh N Desai
(74) *Attorney, Agent, or Firm* — Michael Best & Friedrich LLP

(57) ABSTRACT

An electric machine includes a stator, a rotor positioned adjacent the stator and rotatable with respect to the stator, and a housing that at least partially surrounds the stator. An enclosure is coupled to the housing and includes a first compartment and a second compartment. A plurality of fins are positioned within the second compartment and a fan is coupled to the rotor and directs a flow of air through the second compartment.

22 Claims, 4 Drawing Sheets

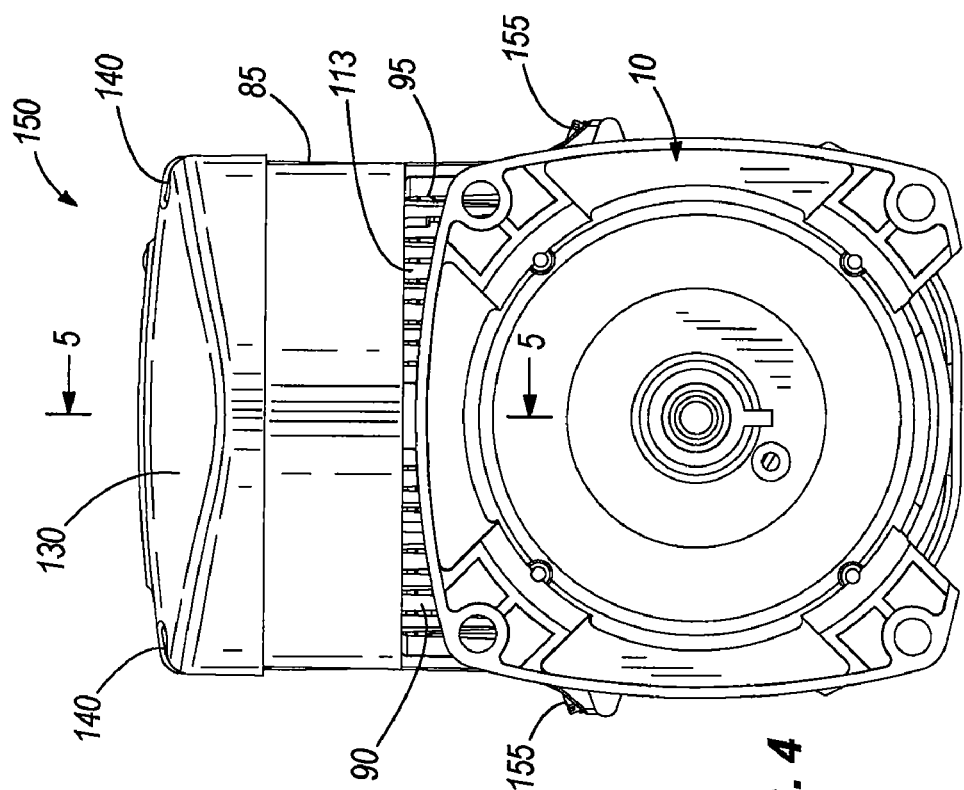
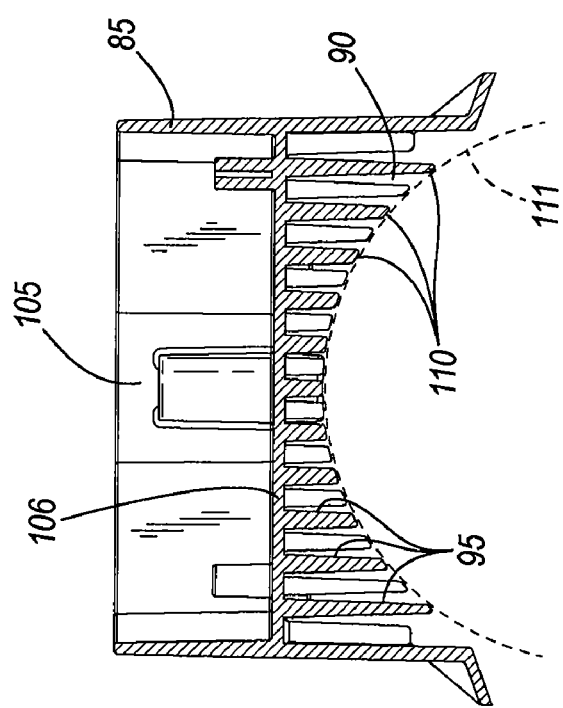
FIG. 3
FIG. 4

ASSEMBLY FOR AN ELECTRIC MACHINE

BACKGROUND

The present invention relates to an enclosure, fan and shroud assembly for an electric machine.

SUMMARY

In one embodiment, the invention provides an electric machine that includes a stator, a rotor positioned adjacent the stator and rotatable with respect to the stator, and a housing that at least partially surrounds the stator. An enclosure is coupled to the housing and includes a first compartment and a second compartment. A plurality of fins are positioned within the second compartment and a fan is coupled to the rotor and directs a flow of air through the second compartment.

In another embodiment, the invention provides an electric machine that includes a stator, a rotor positioned adjacent the stator and rotatable with respect to the stator, and a housing that at least partially surrounds the stator. An enclosure is coupled to the housing and includes a first compartment divided into a drive electronics space and a field wiring space by an electromagnetic interference (EMI) shield. Field wiring terminals are disposed within the field wiring space and drive electronics are disposed within the drive electronics space.

In another embodiment, the invention provides an electric machine that includes a stator, a rotor positioned adjacent the stator and rotatable with respect to the stator, and a housing that at least partially surrounds the stator. An enclosure is coupled to the housing and includes a first compartment, a second compartment and a third compartment. Field wiring terminals are disposed within the first compartment, drive electronics are disposed within the second compartment, and a plurality of fins are positioned within the third compartment. A fan is coupled to the rotor and directs a flow of air through the third compartment. An electromagnetic interference (EMI) shield is disposed between the first compartment and the second compartment. A first cover is removably connected to the first compartment and cooperates with the enclosure to substantially enclose the field wiring terminals, and a second cover is removably connected to the second compartment and cooperates with the enclosure to substantially enclose the drive electronics.

Other aspects of the invention will become apparent by consideration of the detailed description and accompanying drawings.

BRIEF DESCRIPTION OF THE DRAWINGS

FIG. 3 is a cross section of the enclosure of FIG. 2.

FIG. 4 is a rear view of the enclosure, fan and shroud assembly of FIG. 2.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

Figure 1:
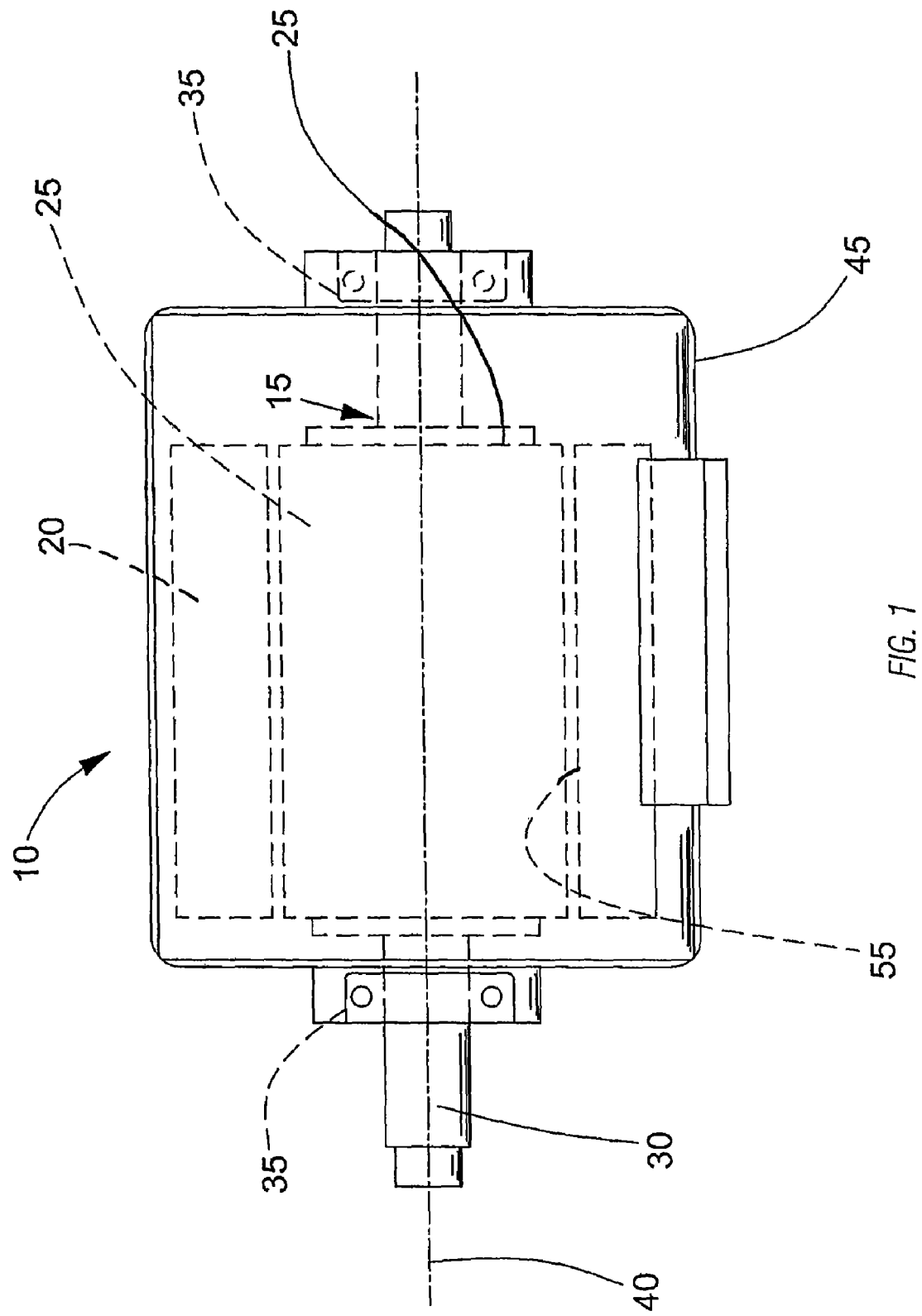
FIG. 1 is a side schematic view of a motor including a rotor.

As illustrated in FIG. 1, a motor 10 generally includes a rotor 15 disposed within a stator 20. The rotor 15 includes a rotor core 25 and a shaft 30 that extends from one or both ends of the rotor core 25 to provide support points and to provide a convenient shaft power take off point. Generally, two or more bearings 35 engage the rotor shaft 30 and support the rotor 15 such that it rotates about a rotational axis 40. The motor 10 also includes a housing 45 having a generally cylindrical shape that supports the stator 20. The stator 20 defines a substantially cylindrical aperture 55 that is centered on the rotational axis 40. When the rotor 15 is in its operating position relative to the stator 20, the rotor core 25 is generally centered within the aperture 55 such that a small air gap is established between the rotor core 25 and the stator 20. The air gap allows for relatively free rotation of the rotor 15 within the stator 20.

The stator 20 includes conductors (e.g., wire) forming one or more phase windings that can be selectively energized to produce a varying magnetic field. The rotor 15 interacts with the varying magnetic field of the stator 20 to produce rotor rotation. As one of ordinary skill will realize, the present invention is suited for other types of electric motors (e.g., induction motors, variable reluctance motors, etc.) and other arrangements of motors (e.g., outer-rotor motors). As such, the invention should not be limited to the motor illustrated herein. Furthermore, one of ordinary skill will realize that the present invention can also be applied to many types of generators. In addition, while the figures and description refer to a motor for a pump, other applications are possible.

Figure 2:
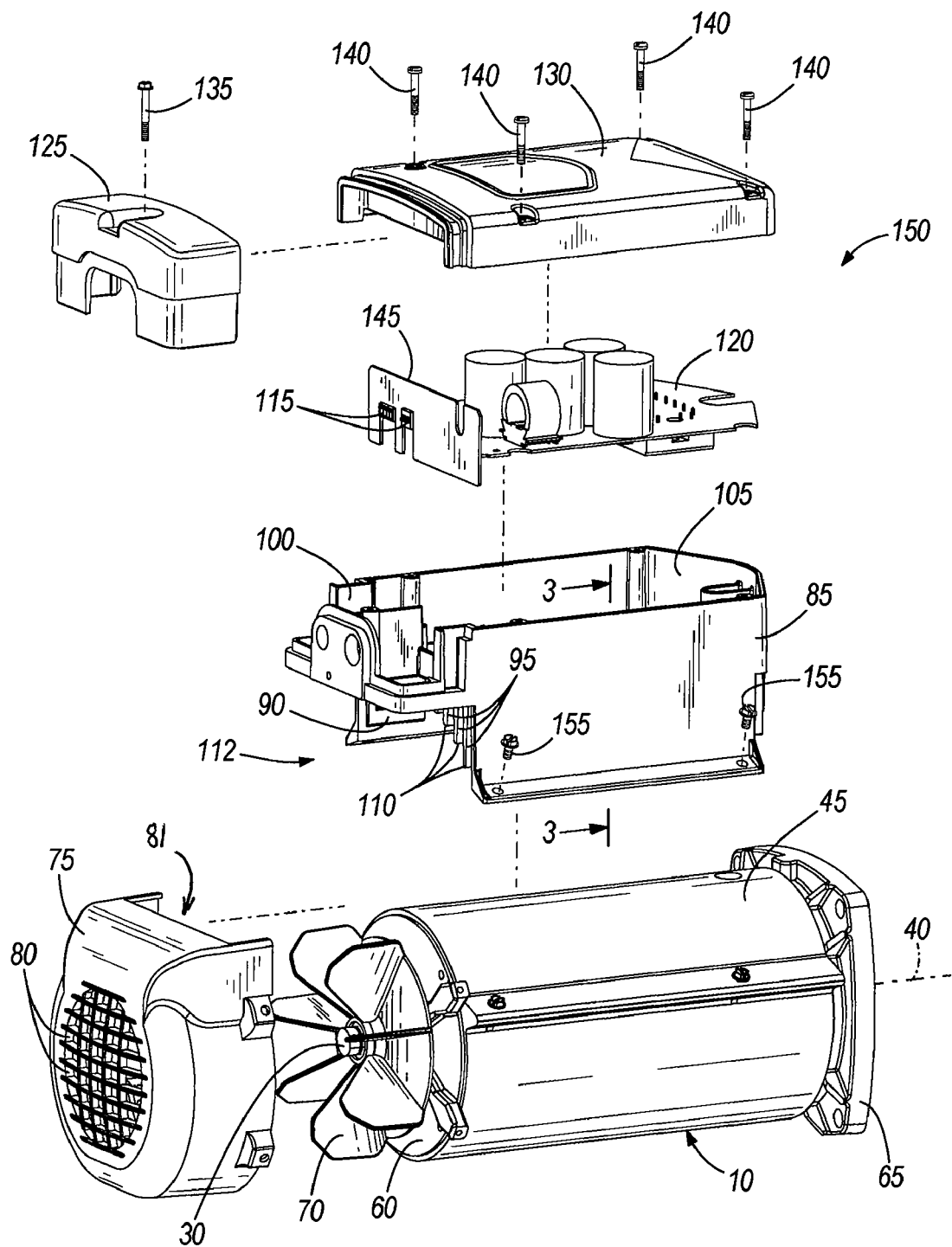
FIG. 2 is an exploded view of an enclosure, fan and shroud assembly for an electric machine.

As illustrated in FIG. 2, the motor 10 includes a first end 60 and a second end 65. A fan 70 is coupled to the shaft 30 at the first end 60 and rotates with the shaft 30. A fan shroud 75 is coupled to the housing 45 near the first end 60 to surround and substantially enclose the fan 70. Openings 80 in the fan shroud 75 allow air to be drawn into the shroud 75 by the fan 70. The fan shroud 75 also defines an outlet opening 81 (shown in FIG. 2) that discharges air upward. In the illustrated construction, a lattice defines the small openings 80. The small openings 80 inhibit the entry of debris.

Also illustrated in FIG. 2 and additionally illustrated in FIG. 3, an enclosure 85 includes a first compartment that at least partially defines a field wiring space 100 and a drive electronics space 105. The enclosure 85 also includes a second compartment that at least partially defines a cooling space 90. Alternatively, the enclosure 85 may be described as having first, second and third compartments, which at least partially enclose the field wiring space 100, the drive electronics space 105, and the cooling space 90, respectively. The enclosure 85 includes a base 106, which separates the cooling space 90 from the field wiring space 100 and from the drive electronics space 105. In the illustrated construction, a plurality of heat sink fins 95 run parallel to the rotational axis 40 of the motor 10 and extend from the base 106 within the cooling space 90. Other constructions may arrange the heat sink fins at other angles with respect to the rotational axis 40 to provide the desired cooling and air flow rates. The plurality of heat sink fins 95 may be formed separately and coupled to the enclosure 85, preferably by way of the base 106, or may be formed with the enclosure 85 as one piece, as shown.

As illustrated in FIG. 3, the plurality of heat sink fins 95 include a plurality of respective distal ends 110, which cooperate to form a generally arcuate shape 111 that matches a portion of the generally cylindrical shape of the motor housing 45. Of course other constructions may arrange the heat sink fins 95 differently as may be required by the particular application.

In one construction, the base 106 and heat sink fins 95 are formed as one piece from a metal or combination of metals, such as aluminum, that provide thermal conductivity and may additionally provide shielding from electromagnetic interference (EMI). In another construction, the base 106 and heat sink fins 95 are metallic with the remainder of the enclosure 85 being injection molded from a plastic material around the metallic components. In still another construction, the enclosure 85, base 106, and heat sink fins 95 are formed as one piece from a suitable metal or combination of metals, as described above.

The enclosure 85 is coupled to the motor housing 45 by way of a plurality of fasteners 155. In the illustrated construction, screws are employed. However, other constructions may employ other fasteners such as studs extending from the motor housing 45 and respective nuts threaded onto the studs, or the like. The motor 10, fan shroud 75, and enclosure 85 cooperate to define a flow path for air drawn by the fan 70. The flow path begins at the openings 80 in the fan shroud 75 where air is drawn into the fan shroud 75 by the fan 70. Then, the air is directed through the outlet opening 81 of the fan shroud 75 to an inlet 112 of the cooling space 90. The air flows between the bottom of the base 106 and the housing 45, and in between the heat sink fins 95 within the cooling space 90. The flow path ends at an outlet 113 (shown in FIG. 4) of the cooling space 90 where the air is discharged back into the atmosphere.

A first cover 125 is removably connected to the enclosure 85 and cooperates with the enclosure 85 to substantially enclose the field wiring space 100. A single fastener 135 couples the first cover 125 to the enclosure 85. In the illustrated construction, a single screw is employed. However, other constructions may employ other fasteners such as hook-and-loop fasteners, studs and nuts, snaps and the like. The use of a single fastener provides for easy access to the field wiring space 100.

A second cover 130 is removably connected to the enclosure 85 and cooperates with the enclosure 85 to substantially enclose the drive electronics space 105. The second cover 130 may be coupled to the enclosure 85 by way of one or more fasteners 140. In the illustrated construction, four screws are employed. However, other constructions may employ more or fewer fasteners, as well as other fasteners such as hook-and-loop fasteners, studs and nuts, snaps and the like. In one construction, the first cover 125 and the second cover 130 are formed of aluminum, or a like material that provides heat dissipation and shielding from EMI. However, in another construction, the first cover 125 and the second cover 130 may employ a plastic material or any other suitable material.

Field wiring terminals 115 are disposed within the field wiring space 100. Field wiring terminals 115 include one or more connectors or wire ends that may be electrically connected to wiring in the field (not shown). The first cover 125 cooperates with the enclosure 85 to substantially enclose the field wiring terminals 115 within the field wiring space 100 to protect them from the elements or undesired contact, and to provide EMI shielding.

Drive electronics 120, such as a circuit board and controller, are disposed within the drive electronics space 105. The second cover 130 cooperates with the enclosure 85 to substantially enclose the drive electronics 120 within the drive electronics space 105 to protect them from the elements or undesired contact, and to provide shielding from environmental EMI.

An EMI shield 145 is disposed between the field wiring space 100 and the drive electronics space 105 to shield the drive electronics 120 from EMI that may be present in the field wiring space 100. For example, in one construction, the EMI shield 145 is formed of steel, or another material that provides shielding from EMI, and is separate and removable from the enclosure 85. However, in another construction, plastic could be injection molded to form the enclosure 85 around the base 106 and fins 95 and the EMI shield 145.

As illustrated in FIG. 2, the motor 10, fan 70, fan shroud 75, enclosure 85, field wiring terminals 115, drive electronics 120, EMI shield 145, first cover 125, second cover 130, fastener 135, fasteners 140, and fasteners 155 form an assembly 150.

Figure 5:
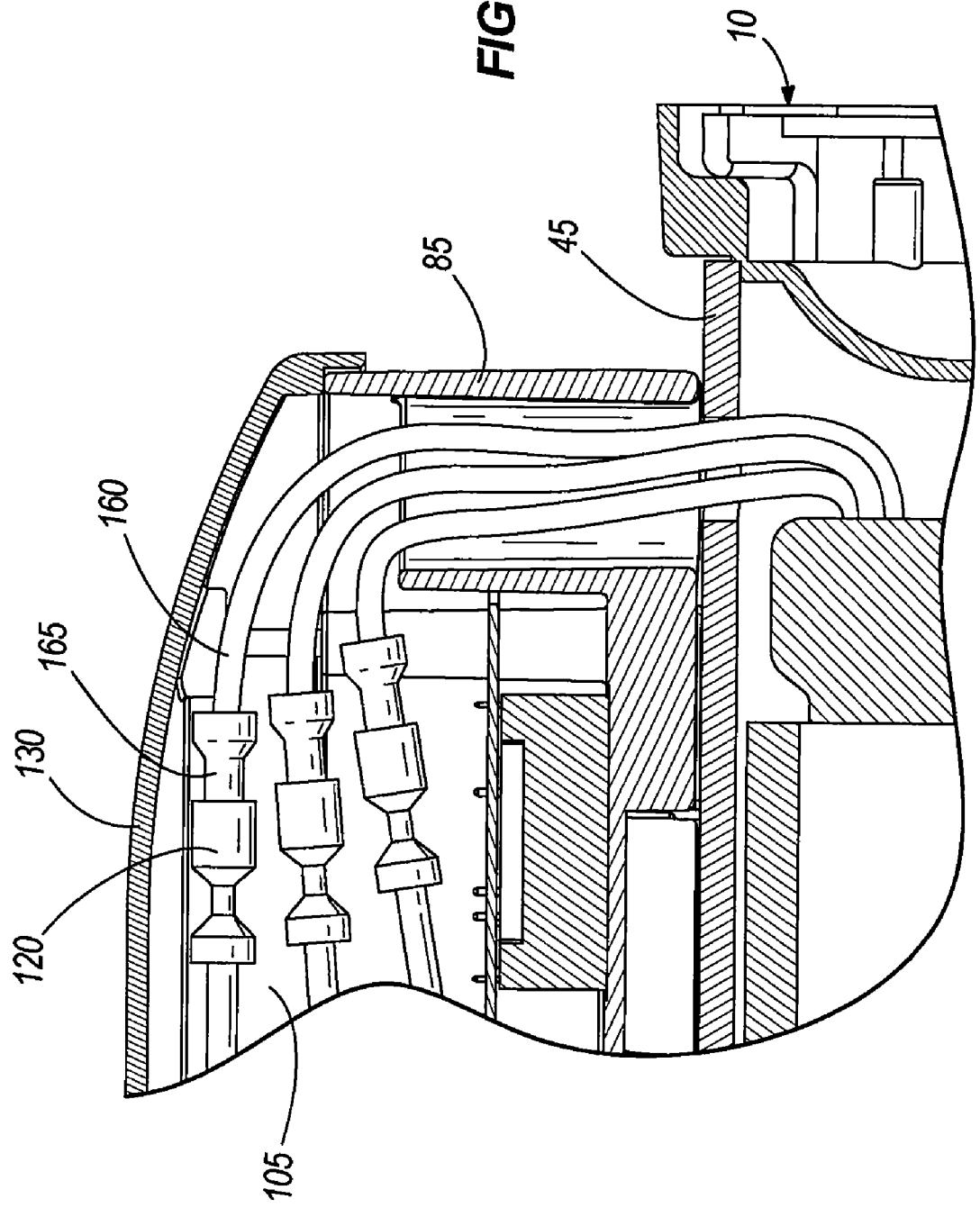
FIG. 5 is a partial cross sectional view of the enclosure, fan and shroud assembly taken along line 5-5 of FIG. 4.

As illustrated in FIG. 5, motor leads 160 exit the motor 10 by way of an aperture in the motor housing 45. The motor leads 160 enter the enclosure 85 by way of a corresponding opening in the enclosure 85. In the illustrated construction, the motor leads 160 each include an end and a connector 165 attached thereto. However, in other constructions, a single connector may be attached to the motor lead ends, collectively. The leads are routed to the drive electronics space 105 and selectively connect to the drive electronics 120. Thus, the connectors 165 are selected to engage with the drive electronics 120.

In operation, the motor 10 and drive electronics 120 produce unwanted heat. The heat is partially absorbed by the base 106 and the fins 75 to be directed out of the assembly 150. The fan shroud 75 in cooperation with the enclosure 85 substantially encloses the first end 60 of the motor 10, including the fan 70 such that the fan 70 directs air along the flow path. Air moved by the fan 70 enters the assembly 150 at the openings 80 in the fan shroud 75, is directed by the fan shroud 75 through the outlet opening 81 in the fan shroud 75 and across the plurality of heat sink fins 95 and the base 106 in the cooling space 90. The air absorbs heat from the plurality of heat sink fins 95 and the base 106 as it passes from the first end or inlet 112 of the cooling space to the second end or outlet 113 of the cooling space 90, where the air and the heat exit the assembly 150.

The assembly 150 allows the drive electronics 120 and the enclosure 85 to be easily separated from the motor housing 45. This allows a customer to replace only failed components rather than the entire assembly 150. For example, if the motor 10 fails, the drive electronics 120 and the enclosure 85 can be disconnected from the motor 10 by disconnecting connectors 165 and by disconnecting the plurality of fasteners 155. The enclosure 85 and the electronics 120 are attached to a replacement motor to produce a working assembly. Thus, the operational portion of the assembly 150 may be salvaged and reused despite a failure of another portion of the assembly.

The assembly 150 also provides ease-of-installation in the field. The field wiring terminals 115 can be easily accessed by removing a single fastener 135 and removing the first cover 125.

Finally, the assembly 150 of the invention provides shielding from EMI. The enclosure 85 and/or the first cover 125 and the second cover 130 may provide EMI shielding from the outside environment. In addition, the base 106 may provide EMI shielding from the motor 10. In addition, the EMI shield 145 shields EMI within the enclosure 85 between the field wiring space and the drive electronics space. Thus, the drive electronics may be shielded from EMI from the environment, from the field wiring, and from the motor 10.

Thus, the invention provides, among other things, an enclosure, fan and shroud assembly for an electric machine. Various features and advantages of the invention are set forth in the following claims.

What is claimed is:

1. An electric machine, comprising:
   a stator;
   a rotor positioned adjacent the stator and rotatable with respect to the stator;
   a housing that at least partially surrounds the stator;
   an enclosure coupled to the housing and including a first compartment and a second compartment separate from the first compartment;
   a plurality of fins coupled to the enclosure and positioned within the second compartment;
   a fan coupled to the rotor and operable to direct a flow of air through the second compartment, wherein the first compartment includes a drive electronics space and a field wiring space;
   a first cover removably connected to the first compartment and cooperating with the enclosure to substantially enclose the field wiring space; and
   a second cover removably connected to the first compartment and cooperating with the enclosure to substantially enclose the drive electronics space.

2. The electric machine of claim 1, wherein the drive electronics space and the field wiring space are separated by an electromagnetic interference (EMI) shield.

3. The electric machine of claim 2, wherein the enclosure is formed from aluminum and the EMI shield is formed from steel.

4. The electric machine of claim 1, wherein the first cover is fastened to the first compartment with a single fastener.

5. The electric machine of claim 1, wherein the plurality of fins include a plurality of first ends coupled to the enclosure and a plurality of distal ends, wherein the plurality of distal ends cooperate to form a generally arcuate shape.

6. The electric machine of claim 1, wherein the plurality of fins are formed as one piece with the enclosure.

7. The electric machine of claim 1, wherein the second compartment includes a first end and a second end, and wherein a fan shroud at least partially surrounds the fan and cooperates with the enclosure to substantially enclose the first end, the fan shroud configured to direct air from the first end of the second compartment toward the second end of the second compartment.

8. The electric machine of claim 1, further comprising a lead exiting the housing, wherein the lead is selectively engageable with the drive electronics.

9. An electric machine, comprising:
   a stator;
   a rotor positioned adjacent the stator and rotatable with respect to the stator;
   a housing that at least partially surrounds the stator;
   an enclosure coupled to the housing and including a base that at least partially defines a first compartment;
   an electromagnetic interference (EMI) shield disposed within the first compartment to divide the first compartment into a drive electronics space and a field wiring space;
   field wiring terminals disposed within the field wiring space;
   drive electronics disposed within the drive electronics space;
   a first cover removably connected to the enclosure adjacent the field wiring space and cooperating with the enclosure to substantially enclose the field wiring space; and
   a second cover removably connected to the enclosure adjacent the drive electronics space and cooperating with the enclosure to substantially enclose the drive electronics space.

10. The electric machine of claim 9, wherein the enclosure is formed from aluminum and the EMI shield is formed from steel.

11. The electric machine of claim 9, further comprising a plurality of fins that extend from the base.

12. The electric machine of claim 11, wherein the plurality of fins are formed as one piece with the enclosure.

13. The electric machine of claim 11, further comprising a fan coupled to the rotor and operable to direct a flow of air across the plurality of fins.

14. The electric machine of claim 11, wherein the plurality of fins include a plurality of first ends coupled to the enclosure and a plurality of distal ends, wherein the plurality of distal ends cooperate to form a generally arcuate shape.

15. The electric machine of claim 9, wherein the first cover is fastened to the enclosure with a single fastener.

16. The electric machine of claim 9, wherein the enclosure includes a first end and a second end, and wherein a fan shroud at least partially surrounds the fan and cooperates with the enclosure to substantially enclose the first end, the fan shroud configured to direct air from the first end of the enclosure toward the second end of the enclosure.

17. An electric machine, comprising:
   a stator;
   a rotor positioned adjacent the stator and rotatable with respect to the stator;
   a housing that at least partially surrounds the stator;
   an enclosure coupled to the housing and including a first compartment, a second compartment and a third compartment;
   field wiring terminals disposed within the first compartment;
   drive electronics disposed within the second compartment;
   a plurality of fins positioned within the third compartment;
   a fan coupled to the rotor and operable to direct a flow of air through the third compartment;
   an electromagnetic interference (EMI) shield disposed between the first compartment and the second compartment;
   a first cover removably connected to the first compartment and cooperating with the enclosure to substantially enclose the field wiring terminals; and
   a second cover removably connected to the second compartment and cooperating with the enclosure to substantially enclose the drive electronics.

18. The electric machine of claim 17, wherein the enclosure is formed from aluminum and the EMI shield is formed from steel.

19. The electric machine of claim 17, wherein the plurality of fins include a plurality of first ends coupled to the third compartment and a plurality of distal ends, wherein the plurality of distal ends cooperate to form a generally arcuate shape.

20. The electric machine of claim 17, wherein the third compartment includes a first end and a second end, the electric machine further comprising a fan shroud at least partially surrounding the fan and cooperating with the enclosure to substantially enclose the first end of the third compartment, wherein the fan shroud directs air from the first end of the third compartment toward the second end of the third compartment.

21. The electric machine of claim 17, further comprising leads exiting the housing, wherein the leads have an end and a connector attached to the end, and wherein the connector is selectively engageable with the drive electronics.

22. The electric machine of claim 17, wherein the first cover is fastened to the first compartment with a single fastener.

* * * * *